United States Patent [19]

Van de Walle

[11] Patent Number: 5,828,684
[45] Date of Patent: Oct. 27, 1998

[54] DUAL POLARIZATION QUANTUM WELL LASER IN THE 200 TO 600 NANOMETERS RANGE

[75] Inventor: Christian Gilbert Van de Walle, Sunnyvale, Calif.

[73] Assignee: Xerox Corporation, Stamford, Conn.

[21] Appl. No.: 581,711

[22] Filed: Dec. 29, 1995

[51] Int. Cl.[6] ............................... H01S 3/19; H01S 3/10
[52] U.S. Cl. .................................. 372/45; 372/27; 372/46
[58] Field of Search ............................... 372/45, 50, 27, 372/46

[56] References Cited

U.S. PATENT DOCUMENTS

| 5,079,774 | 1/1992 | Mendez et al. | 372/45 |
| 5,383,211 | 1/1995 | Van De Walle et al. | 372/45 |
| 5,465,263 | 11/1995 | Bour et al. | 372/45 |
| 5,497,390 | 3/1996 | Tanaka et al. | 372/45 |
| 5,646,953 | 7/1997 | Naito et al. | 372/46 |

OTHER PUBLICATIONS

Nakamura et al., "Candela–class High–Brightness InGaN/AlGaN Double–Heterostructure Blue–Light–Emitting Diodes", Appl. Phys. Lett., vol. 64, No. 13, pp. 1687–1689, Mar. 1994.

*Primary Examiner*—Rodney B. Bovernick
*Assistant Examiner*—Luong-Quyen T. Phan
*Attorney, Agent, or Firm*—William Propp

[57] ABSTRACT

A semiconductor laser source using a strained active layer of an indium gallium aluminum nitride ($In_xGa_{1-x-y}Al_yN$) quaternary alloy to obtain semiconductor laser sources that emit TE or TM polarized light in the wavelength range of 200 to 600 nm.

19 Claims, 4 Drawing Sheets

DUAL POLARIZATION QUANTUM WELL LASER IN THE 200 TO 600 NANOMETERS RANGE

BACKGROUND OF THE INVENTION

This invention relates to a quantum well laser and, more particularly, to a quantum well laser for emitting TE or TM polarized light in the 200 to 600 nanometers range, most especially in the range of 350 to 450 nanometers.

Quantum well (QW) lasers normally emit coherent light in the transverse electric (TE) polarization rather than the transverse magnetic (TM) polarization. In most semiconductor materials allowing heavy hole and light hole transition, the n=1 heavy hole transition is the fundamental (lowest energy) transition and the lowest energy state is the state whose population is most easily inverted. The heavy hole is lowest in energy because the quantum shifts are inversely proportional to the effective mass; therefore, the light hole levels are shifted to higher energy levels than the heavy hole levels.

In a quantum well laser, the TE-mode gain arises from the heavy hole transition, while the TM-mode gain is provided by the light hole transitions.

Individually addressable quantum well (QW) lasers can however emit coherent light in the transverse electric (TE) or in the transverse magnetic (TM) mode. Quantum well (QW) lasers can switch from emitting coherent light in the TE polarization mode to the TM polarization mode, or vice versa. This ability to emit coherent light in either the TE or TM polarization states is accomplished in certain semiconductor material laser structures by controlling the type of strain induced in the epitaxially deposited active region due to lattice mismatches with the substrate.

TE polarization gain will predominate in most material systems allowing heavy hole and light hole transition, when the n=1 heavy hole is the lowest energy state and therefore the state whose population is most easily inverted, which is usually true for unstrained and compressively strained III-V alloy systems. However, by reversing the light hole and heavy hole band edges, achieved in certain semiconductor material laser structures by inducing tensile strain into the active region, TM polarization gain will predominate. In the degenerate condition, where the light hole and heavy hole bands are substantially coincident in energy, the polarization of the emission can be determined by threshold carrier density and other factors, such as temperature, facet reflectivity, cavity length and intracavity optical loss.

TM polarization can be obtained by subjecting the active layer to biaxial tension, parallel to the plane of the junction of the active layer and the cladding layers.

In general, the desired polarization mode laser emitter can be achieved with either a single quantum well, carefully adjusted, or separate quantum wells for TE and TM mode gain with the polarization mode of laser oscillation dependent upon the modal gain characteristics and the threshold gain. The necessary gain characteristic has one polarization with lowest transparency current, and the orthogonal polarization with a greater peak gain. For some range of active region parameters (thickness, composition, placement within the confining region, etc.), these characteristics can be obtained, and so the polarization will be determined by the threshold gain. Therefore, the polarization of each device can be selected, for example, by introducing an additional loss into one of the devices, thereby forcing it to emit coherent light in the higher-gain polarization.

On the other hand, a device without this additional loss will simply emit coherent light in the polarization which has lowest transparency current. The additional loss could be provided by an unpumped section along the cavity, low mirror reflectivity, shorter cavity, etc. Similarly, the polarization of each device could be switched, by using an intracavity loss modulator.

This polarization selectivity mechanism is demonstrated by the polarization-dependent gain-current characteristics shown in FIG. 1. Modal gain is plotted as a function of device current, for both the TM and TE modes. The modal gain, g, for both TM and TE modes is plotted vertically along the y coordinate, and current, I, for both modes is plotted horizontally along the x coordinate. The curve 10 labeled TE shows the gain characteristic for the TE-mode, and the curve 11 labeled TM shows the gain characteristic for the TM-mode. Under certain conditions, the quantum well, when caused to lase at the lower threshold current 13 will emit TE-polarized radiation because the TE gain is higher for that current. Under other conditions, usually by introducing loss, when the threshold current exceeds the crossover 14, the quantum well will lase in the TM mode represented by the curve 15 because the TM-gain is higher for that current.

Prior art quantum well lasers can emit polarized coherent light beams in either the TE and TM polarization states in the wavelength range of about 600 to 650 nanometers or in the range above 650 nanometers. However, there are important applications for laser devices that emit polarized coherent light beams in either the TE and TM polarization states in the wavelength range significantly below the 600 nanometer limit.

An object of the invention is a monolithic laser capable of operation over a wavelength range between 200 to 600 nanometers, most especially in the range of 350 to 450 nanometers.

A further object of the invention is a quantum well laser switchable between TE and TM polarization modes over a wider wavelength range between 200 to 600 nanometers, most especially in the range of 350 to 450 nanometers.

Another object of the invention is a TM-mode semiconductor laser for the wavelength range between 200 to 600 nanometers, most especially in the range of 350 to 450 nanometers.

SUMMARY OF THE INVENTION

A semiconductor laser source using a strained active layer of an indium gallium aluminum nitride ($In_xGa_{1-x-y}Al_yN$) quaternary alloy to obtain semiconductor laser sources that emit TM or TE-polarized light in the wavelength range of 200 to 600 nm.

An InGaAlN quantum well semiconductor laser structure can also switch polarizations between the TM-mode and the TE-mode. An InGaAlN quantum well semiconductor laser can generate orthogonally polarized multiple beams.

The laser incorporates quantum well active regions capable of transitions to heavy hole and light hole band edges. The heavy hole transition provides TE-mode gain, while the light hole band provides mostly TM-mode gain. By controlling the compositions and thicknesses of the active regions, both modes can be obtained in a monolithic structure.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 2:
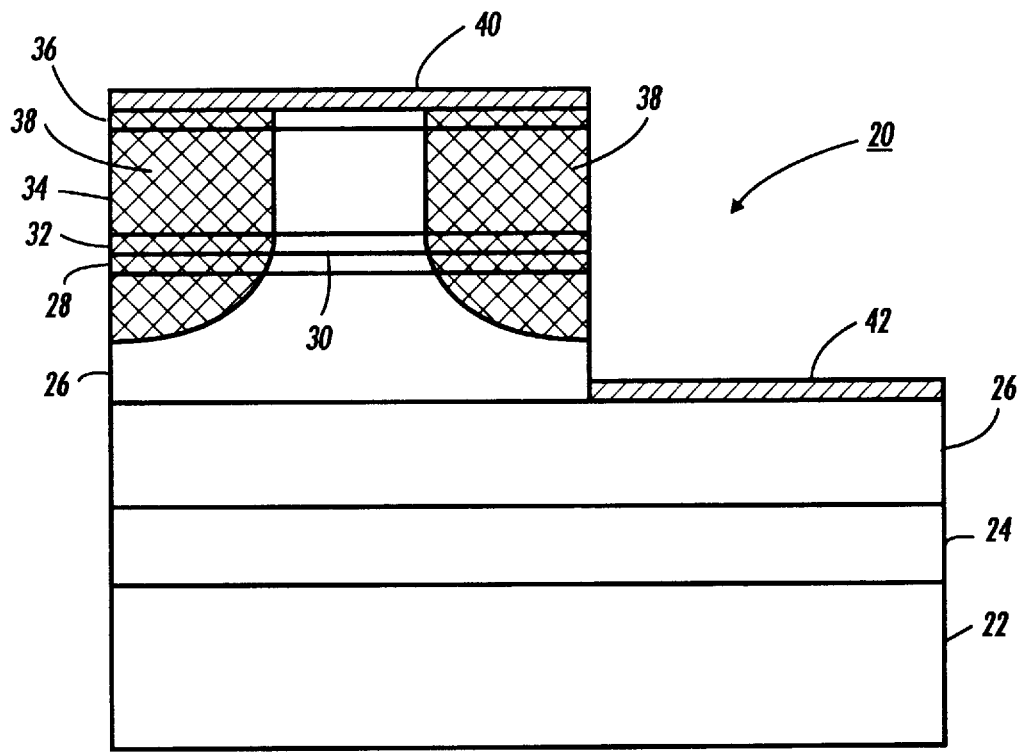
FIG. 2 is a schematic illustration of the cross-section side view of an indium gallium aluminum nitride semiconductor laser structure formed according to the present invention.

Reference is now made to FIG. 2 wherein is described the basic III-V nitride based semiconductor alloy diode laser 20 of the present invention. The semiconductor laser structure 20 has a sapphire ($Al_2O_3$) substrate 22 on which is epitaxially deposited, in a known manner, a succession of semiconductor layers comprising, in order, a GaN buffer layer 24, a lower n-GaAlN cladding layer 26, a lower n-InGaAlN optical and carrier confinement layer 28, a GaInN active quantum well layer 30, an upper p-InGaAlN optical and carrier confinement layer 32, an upper p-GaAlN cladding layer 34, and a n-GaN cap or contact layer 36 The laser structure 20 can be fabricated by a technique such as metalorganic chemical vapor deposition (MOCVD) as is well known in the art.

Typically, the conductivity types of the semiconductor layer below the active layer 30 are N-type conductivity and the conductivity types above the active layer 30 are P-type conductivity, except for the substrate 22 and the buffer layer 24.

N-diffused regions 38 can optionally be formed by masking sections of the top surface of the p-cap layer 36 and selectively diffusing a high concentration n-impurity dopant, such as silicon, under heat through the upper layers of the monolithic laser structure 20 down partially into the lower n-GaAlN cladding layer 26. The N-diffused impurity induced disordered regions 34 are provided to electrically and optically isolate the laser structure by current confinement and optical confinement of the emitted beam. The optional N-diffused impurity induced disordered regions 34 could be replaced with optional regrown flanking layers.

A p-ohmic metal electrode 40 is formed on the contact layer 36. The contact layer 36, the upper p-cladding layer 34, the upper p-confinement layer 32, the active quantum well layer 30, the lower n-confinement layer 28 and partially into the n-cladding layer 26 are etched away (prior to the formation of the n-diffused regions 38) so that the n-ohmic contact metal electrode 42 can be formed on the n-cladding layer 26 The etching of the semiconductor structure 20 can be done by conventional etching techniques, such as chemical etching and ion etching. Not shown are the usual reflecting facets forming the optical cavity with and perpendicular to the quantum well active layer 30 at opposite ends of the laser structure 20.

Gallium nitride (GaN) can form alloys with the other nitride-based III-V semiconductor materials of indium nitride (InN) and aluminum nitride (AlN) such as ternary alloys of indium gallium nitride ($In_xGa_{1-x}N$) and gallium aluminum nitride ($Ga_{1-y}Al_yN$) and a quaternary alloy of indium gallium aluminum nitride ($In_xGa_{1-x-y}Al_yN$).

In accordance with the invention, an indium gallium aluminum nitride ($In_xGa_{1-x-y}Al_yN$) quaternary alloy is used in the active layer 30 of the diode laser 20.

Gallium nitride (GaN) is a direct bandgap semiconductor with a bandgap of 3.44 eV which, when used as an active layer in a semiconductor laser, emits light at 361 nanometers in the ultraviolet spectrum. By forming ternary or quaternary alloys of GaN with indium nitride (InN) with a bandgap of 2.05 eV and aluminum nitride (AlN) with a bandgap of 6.28 eV, a variety of bandgaps corresponding to wavelengths in the visible and ultraviolet spectral range can be obtained. In principle, wavelengths from 650 nanometers for InN to 200 nanometers for AlN can be emitted by the semiconductor laser.

Because of issues relating to growth and commercial availability of particular substrates, as well as the difficulty of laser operation in the very short wavelength range, the semiconductor laser structures in the present application shall concentrate on the wavelength range around 350 to 450 nanometers, corresponding to active layers of $In_xGa_{1-x-y}Al_yN$ predominantly composed of GaN.

The nitride-based III-V semiconductors occur naturally in the wurtzite structure. However, GaN can be stabilized in the zincblende structure by growth on particular substrates. For purposes of this discussion, growth in the zincblende structure is assumed, characterized by a single lattice constant, $a=a_{zb}$, which is related to the in-plane lattice constant of the wurtzite structure, $a_w$, by $a_{zb}=\sqrt{2a_w}$ However, growth in the wurtzite structure by the nitride-based III-V semiconductors is also possible and equally applicable.

The lattice constants for the nitride-based III-V semiconductor materials are 4.49 Å for GaN, 5.00 Å for InN and 4.40 Å for AlN, as shown in *Data in Science and Technology, Semiconductors: Group IV Elements and III-V Compounds*, edited by O. Madelung, Springer-Verlag, Berlin, 1991.

Figure 3:
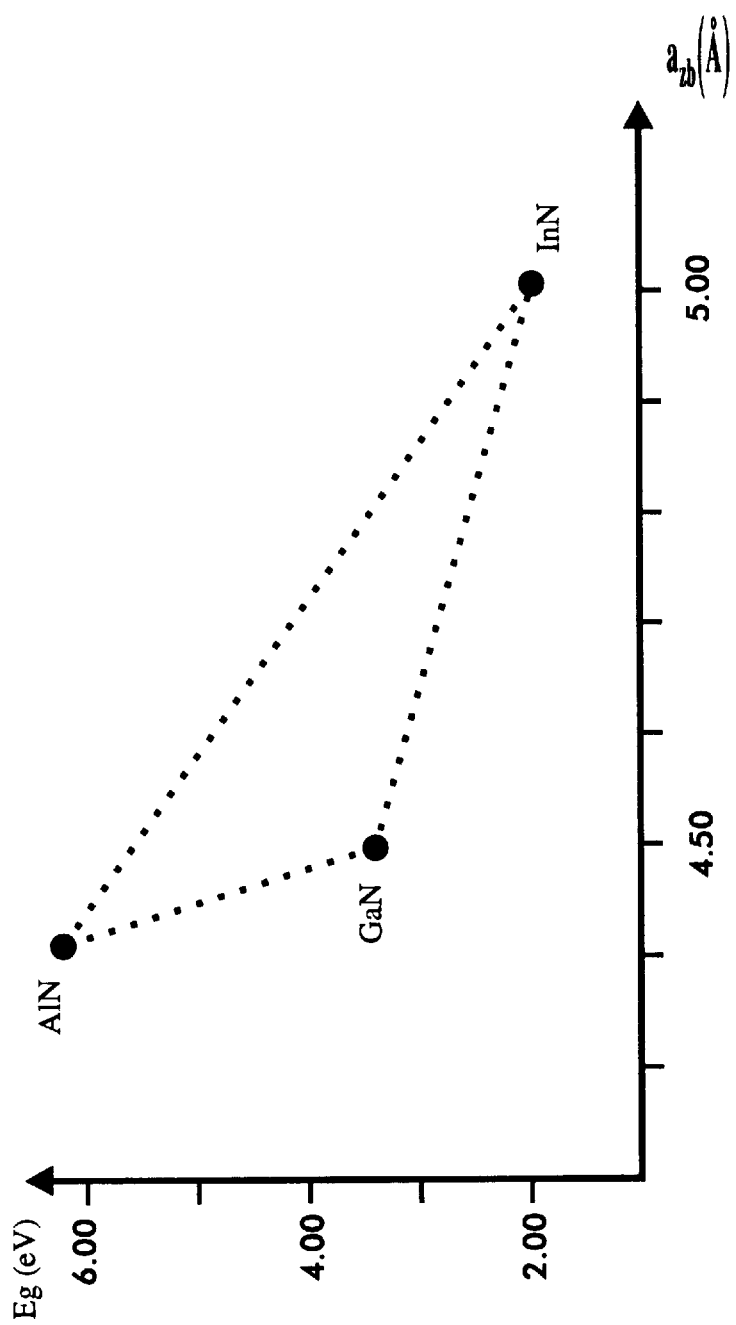
FIG. 3 is a graph showing the unstrained bandgap energies and lattice parameters for three III-V semiconductor nitrides, GaN, InN and AlN.

FIG. 3 illustrates the relationship between the energy bandgap and the lattice constant for GaN, InN and AlN. The bandgaps range from 2.05 eV for InN to 6.28 eV for AlN and the lattice constants range from 4.40 Å for AlN to 5.00 Å for InN with GaN having an intermediate bandgap of 3.44 eV and an intermediate lattice constant of 4.49 A.

Bandgaps for ternary alloys of $In_xGa_{1-x-y}Al_yN$ where either x or y=0 are indicated by the dotted lines in FIG. 3. The bandgap for the quaternary alloy of $In_xGa_{1-x-y}Al_yN$ will be within the area bounded by the dotted lines of the ternary alloys. The binary alloy of $In_xGa_{1-x-y}Al_yN$ where x=0 and y=0 is, of course, GaN. For ease of understanding, no bowing of the bandgap lines is shown.

Various semiconductor materials can be used for the substrate 22 in the semiconductor laser of FIG. 2 with a nitride-based III-V semiconductor active layer 30 of $In_xGa_{1-x-y}Al_yN$. The nitride-based III-V semiconductor layers of the cladding, confinement and active layers can be epitaxially grown on a substrate with a lattice constant within or close to the range spanned by AlN, GaN and InN of FIG. 3. Examples of such substrates would be bulk AlN, bulk GaN, bulk InN, bulk SiC (with a lattice constant of 4.36 Å) and bulk zinc oxide (ZnO) which has a lattice constant of 4.60 Å. The use of a boron phosphide (BP) substrate for a $In_xGa_{1-x-y}Al_yN$ semiconductor electronic device, including a semiconductor laser structure, is discussed in U.S. patent application Ser. No. (D/95587), commonly assigned with the present-application and herein incorporated by reference.

Alternately, the substrate can be any semiconductor material with any lattice constant, even a lattice constant far outside the range between 4.40 A to 5.00 A. The substrate can be chosen for reasons other than its lattice constant, such as thermal properties, mechanical stability, or commercial availability. A buffer layer, as in 24 in FIG. 2, is epitaxially deposited or grown on the substrate to a sufficient thickness such that buffer layer is effectively totally relaxed to a desired lattice constant between 4.40 Å to 5.00 Å. This buffer layer can consist of one or more layers of nitride binary or ternary III-V semiconductor compounds such as AlN, GaN or InN or other semiconductor materials such as ZnO, SiC or BP which have a lattice constant between 4.40 Å to 5.00 Å.

The nitride-based III-V semiconductor layers of the cladding, confinement and active layers can then be epitaxially grown on the buffer layer and for all optical and semiconductor purposes, the epitaxial growth will behave as growth upon a substrate within the desired lattice constant range.

The term "substrate" shall refer to both a substrate of semiconductor material within the desired lattice constant or a substrate of other semiconductor material with a suitably thick buffer layer of semiconductor material with the desired lattice constant.

The nitride-based III-V semiconductor layers of the cladding, confinement and active layers will have varying compositions of $In_xGa_{1-x-y}Al_yN$.

The lattice constant, a, of the quaternary semiconductor layer of $In_xGa_{1-x-y}Al_yN$ can be written from Vegard's Law as $$a = (1-x-y)a(GaN) + x\,a(InN) + y\,a(AlN) = 4.49 + 0.51x - 0.09y \text{ (in A)} \quad \text{(Equation 1)}$$

The bandgap, Eg, of the quaternary semiconductor layer of $In_xGa_{1-x-y}Al_yN$ can be written as $$Eg = (1-x-y)Eg(GaN) + x\,Eg(InN) + y\,Eg(AlN) = 3.44 - 1.39x + 2.84y \text{ (in eV)} \quad \text{(Equation 2)}$$

The lattice constant of $In_xGa_{1-x-y}Al_yN$ is more sensitive to the addition of indium than to aluminum and the bandgap of $In_xGa_{1-x-y}Al_yN$ is more sensitive to the addition of aluminum than to indium as shown in FIG. 3. Since the ternary and quaternary semiconductor layers of $In_xGa_{1-x-y}Al_yN$ have two alloy composition parameters (x and y), the composition of the semiconductor layers of $In_xGa_{1-x-y}Al_yN$ can be adjusted to satisfy two criteria: (1) the lattice constant and (2) the bandgap.

Optical and carrier confinement in the semiconductor laser 20 of FIG. 2 is achieved by sandwiching the quantum well active layer 30 which has a smaller bandgap between confinement layers 28 and 32 with a larger bandgap than the active layer. The cladding layers are typically doped for a p-type upper cladding layer 34 and a n-type lower cladding layer 26 to provide current injection as a p-n junction for the quantum well active layer 30.

The confinement layers 28 and 32 and the cladding layers 26 and 34 should be lattice matched to the buffer layer 24 to avoid the presence or formation of extended defects which interfere with laser operation.

The quantum well active layer 30 is thinner than the confinement layers 28 and 32 and the cladding layers 26 and 34. There exists a composition (strain)-dependent critical thickness, below which the quantum well is pseudomorphic and free of interfacial misfit dislocations.

As long as the thickness of the active layer is less than the critical layer thickness, the lattice constant of the active layer can deviate from the substrate lattice constant by as much as several percent. The lattice constant mismatch can be accommodated through pseudomorphic strain, which encompasses both tensile and compressive strain. This strain on the active layer affects the band structure which can be used to obtain TE or TM light emission from the active layer.

It is possible to tensile strain the active region to achieve TM-mode polarization. This is shown schematically in FIG. 4 where the band energy is plotted vertically, with $E_c$ representing the combination band edge and $E_v$ the valence band edge, and lh and hh the light hole and the heavy hole band edges, respectively.

Figure 4:
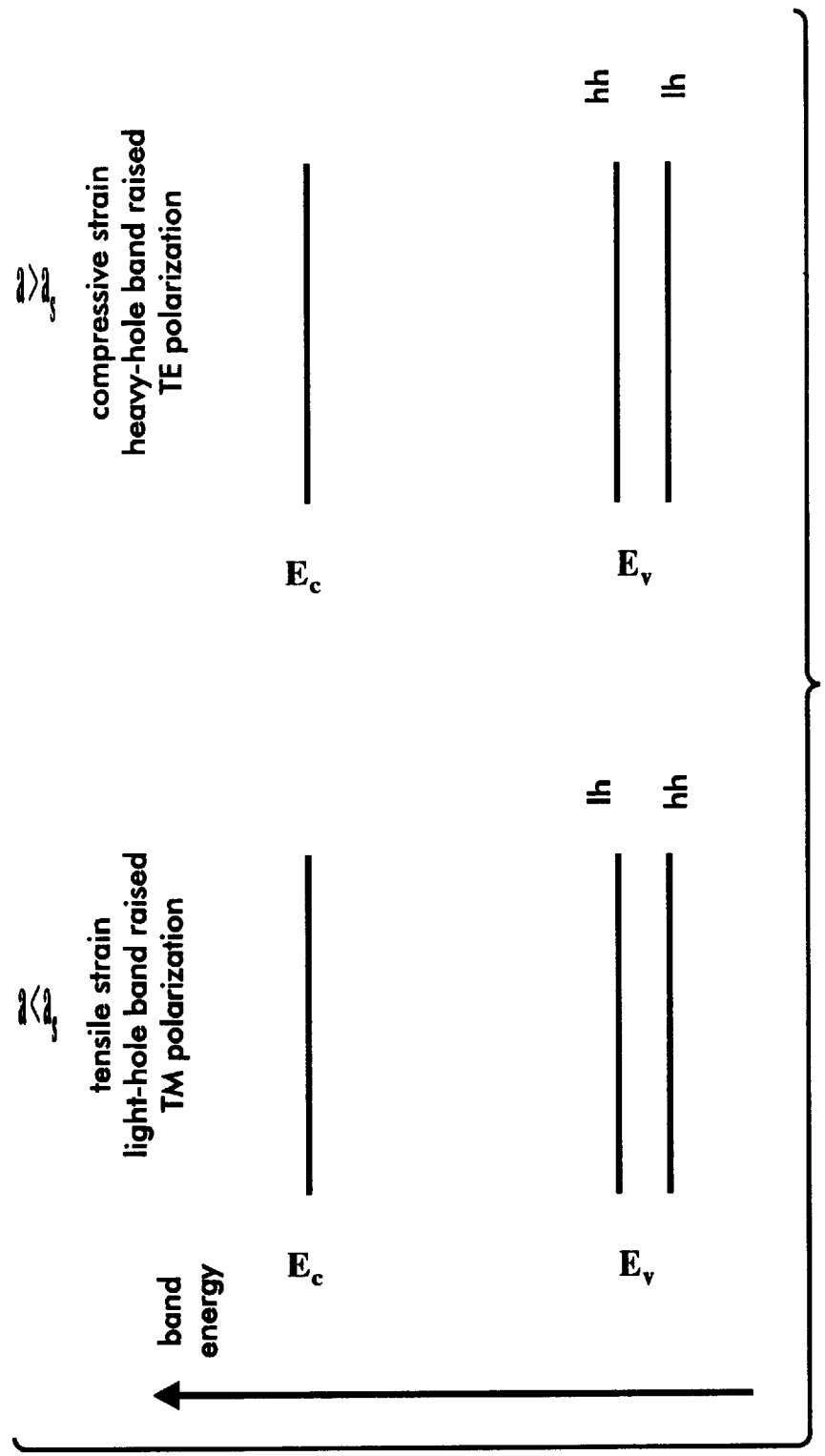
FIG. 4 is a schematic band diagram showing the lattice constant, tensile or compressive strain and the polarization from energy levels for the heavy hole and the light hole.

In order to emit TM-polarized light, the light hole band must be the valence band ground state, which can be accomplished by introducing biaxial tensile strain in the active layer 30. For that purpose, the lattice constant of the active layer 30 should be smaller than the lattice constant of the substrate 22 as shown in FIG. 4. The lattice constant of the layer can be made smaller by reducing the In content, if any, in the $In_xGa_{1-x-y}Al_yN$ active layer, or increasing the Al content in the $In_xGa_{1-x-y}Al_yN$ active layer. The choice should be made based on the desired wavelength for light emission from the active layer.

The bandgap equation [2] provides a good first order approximation for adjusting x and y in the $In_xGa_{1-x-y}Al_yN$ active layer for the semiconductor laser to emit a beam with a certain desired wavelength.

In order to emit TE-polarized light, the heavy hole band must be the valence band ground state, which can be accomplished by introducing biaxial compressive strain in the active layer 30. For that purpose, the lattice constant of the active layer 30 should be larger than the lattice constant of the substrate 22 as shown in FIG. 4. The lattice constant of the layer can be made larger by increasing the In content in the $In_xGa_{1-x-y}Al_yN$ active layer, or reducing the Al content in the $In_xGa_{1-x-y}Al_yN$ active layer. Again, the choice should be made based on the desired wavelength for light emission from the active layer.

Figure 5:
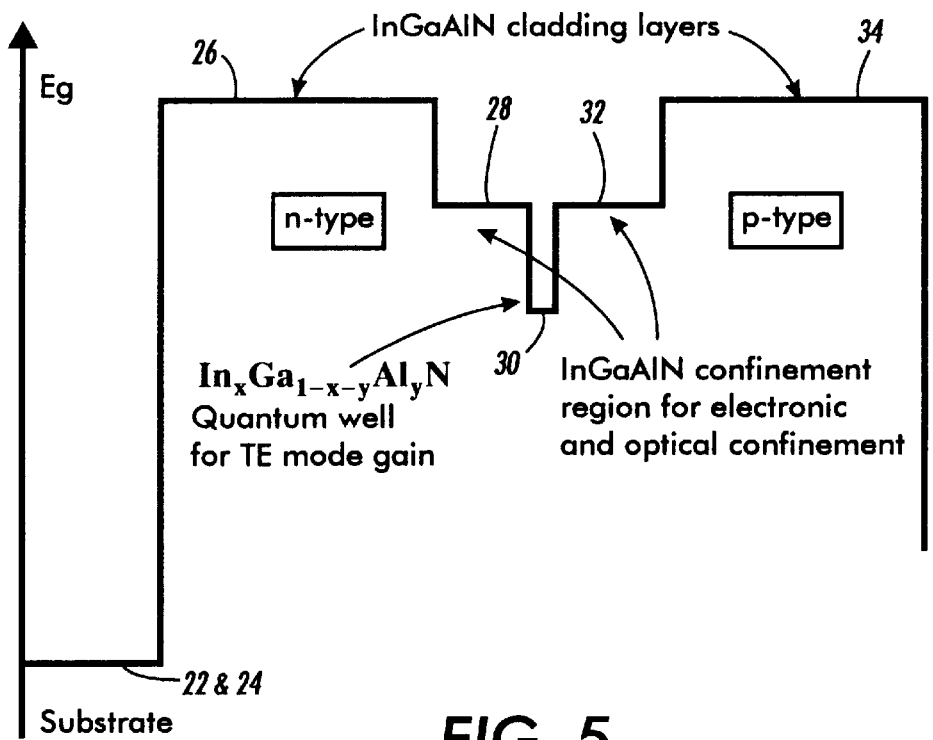
FIG. 5 is a graph showing the band-gap profile of the semiconductor laser structure of FIG. 2 with a single quantum well for TE/TM mode polarization.

The bandgap energy profile for the FIG. 2 semiconductor laser structure with InGaAlN quantum well active region and InGaAlN cladding and confinement layers is illustrated in FIG. 5. FIG. 5 also shows that in the usual way the conductivity types below (in FIG. 2) the typically undoped quantum well regions are n-type and those regions above are p-type. By changing the In and/or the Al concentrations of the active layer, the active layer can either be subjected to pseudomorphic tensile strain, which produces TM polarized light emission, or to compressive strain, which produces TE polarized light emission.

For example, a semiconductor laser structure can be grown on a substrate which has the same lattice constant, a equal 4.49 Å, as bulk GaN. In an unstrained structure, the active layer could consist of pure GaN. The composition of the $In_xGa_{1-x-y}Al_yN$ confinement and cladding layers would be chosen based on two requirements: (1) to have the same lattice constant as the substrate, and (2) to exhibit a desired bandgap difference with the active layer. For a bandgap which is 0.5 eV larger than that of the active layer of unstrained GaN (or an Eg of 3.94 eV) and the lattice constant the same as the substrate of 4.49 Å, Equations [1] and [2] yield an x of 0.03 and a y of 0.19. Thus the composition of the confinement and cladding layers would be $In_{0.03}Ga_{0.78}Al_{0.19}N$. The wavelength of such a GaN active layer semiconductor laser would be 361 nanometers (in the ultraviolet range of the spectrum), neglecting quantum well confined effects.

The lattice constant of the active layer should be increased, typically by adding In to the $In_xGa_{1-x-y}Al_yN$ active layer, to obtain TE polarization. An $In_{0.10}Ga_{0.90}N$ active layer has a lattice constant of 4.54 Å and will be subject to a 1 percent compressive strain when grown on the substrate with lattice constant 4.49 Å. The unstrained bandgap of $In_{0.10}Ga_{0.90}N$ is 3.30 eV.

To obtain TM polarization for a lattice constant of 4.49 Å, Al needs to be added to the $In_xGa_{1-x-y}Al_yN$ active layer. An $Ga_{0.78}Al_{0.22}N$ active layer will be subject to 0.5 percent tensile strain when grown on the substrate with lattice constant 4.49 Å. However, as can be seen from Equation [2], increasing the Al content also increases the bandgap significantly: the unstrained bandgap of $Ga_{0.78}Al_{0.22}N$ is 3.07 eV. Leaving the bandgap that large will cause the laser to emit light at shorter wavelengths. Accordingly, the Al content of the confinement and cladding layers will be increased. With a lattice constant of 4.49 Å and a bandgap of 4.51 eV, Equations [1] and [2] yield an x of 0.07 and a y of 0.41. Thus the composition of the confinement and cladding layers in a TM mode laser would be $In_{0.07}Ga_{0.52}Al_{0.41}N$.

In another example, an $In_xGa_{1-x-y}Al_yN$ laser emits light at approximately 500 nanometers wavelength in the blue-green range of the spectrum. The substrate will have a lattice constant of 4.80Å such as a relaxed buffer layer of $In_{0.61}Ga_{0.39}N$. The cladding and confinement layers with a bandgap difference of about 0.5 eV from the active layer and lattice matched to the substrate would be $In_{0.64}Ga_{0.17}Al_{0.19}N$.

The unstrained active layer would be $In_{0.61}Ga_{0.39}N$. In the TM mode of tensile strain and the requirement that the active layer have a smaller lattice constant, the In content would be reduced. An $In_{0.51}Ga_{0.49}N$ active layer would have a bandgap of 2.73 eV and a lattice constant of 4.75 Å yielding a tensile strain of 1 percent.

In the TE mode of compressive strain and the requirement that the active layer have a larger lattice constant, the In content would be increased. An $In_{0.71}Ga_{0.29}N$ active layer would have a bandgap of 2.45 eV and a lattice constant of 4.85 Å yielding a compressive strain of 1 percent.

Using the alloy system of the invention, it is also possible to adjust exactly the thickness and composition of a single quantum well, so that the light hole and the heavy hole band edges are degenerate or very nearly degenerate. In this case, a TE/TM mode switchable device can be made roughly similar. The polarization of the laser emission will be determined by the threshold gain, and the gain-current relationship for each mode as described in connection with FIG. 1.

Figure 1:
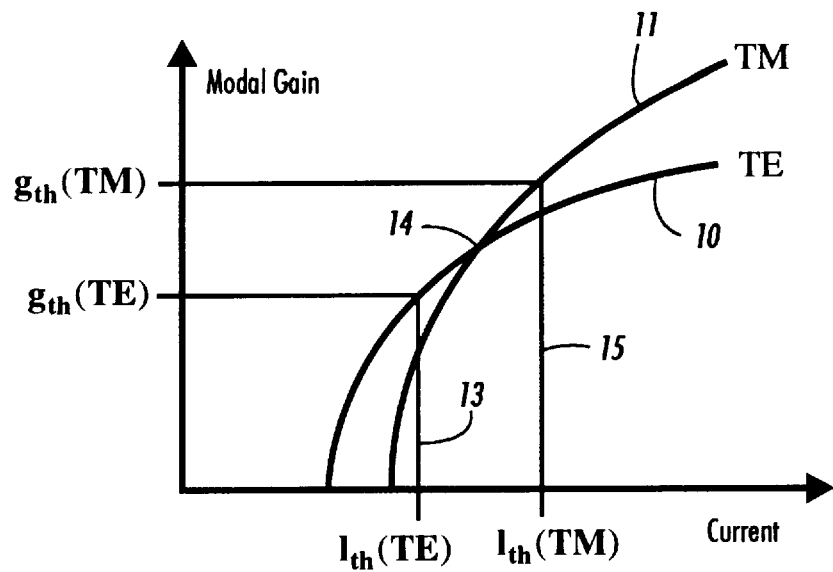
FIG. 1 is a graph showing the gain-current characteristic of one form of semiconductor laser structure formed according to the present invention.

To achieve polarization switching in an exactly-adjusted single QW, the gain-current relationship must have certain characteristics. As shown in FIG. 1, the transparency current must be lowest in one polarization, curve 10, while the peak gain is greatest in the orthogonal polarization, curve 11. Therefore, one polarization, TE, has a lower threshold current, while the other (higher gain) polarization, TM, only oscillates if the threshold gain is increased. This can be achieved, for example, by including an intracavity loss modulator section in the device.

A layer structure capable of either TE or TM mode emission can also include separate quantum wells for TE and TM mode gain. For example, shown in FIG. 6, the bandgap energy profile for a two quantum well structure 29 contains a biaxially compressed $In_xGa_{1-x-y}Al_yN$ active quantum well layer 50 for TE mode gain at wavelengths less than 600 nanometers and an $In_xGa_{1-x-y}Al_yN$ active quantum well layer 52 under biaxial tension for TM mode gain at the same wavelength. As in the case of a single exactly adjusted quantum well, the polarization will depend on the gain and loss characteristics. In principle, the quantum wells can be adjusted so that one polarization has a lower transparency current, while the other has a higher gain. Therefore, the lowest threshold polarization emits coherent light when the loss is low, and the high gain (and higher threshold) polarization dominates when an additional loss is introduced.

Figure 6:
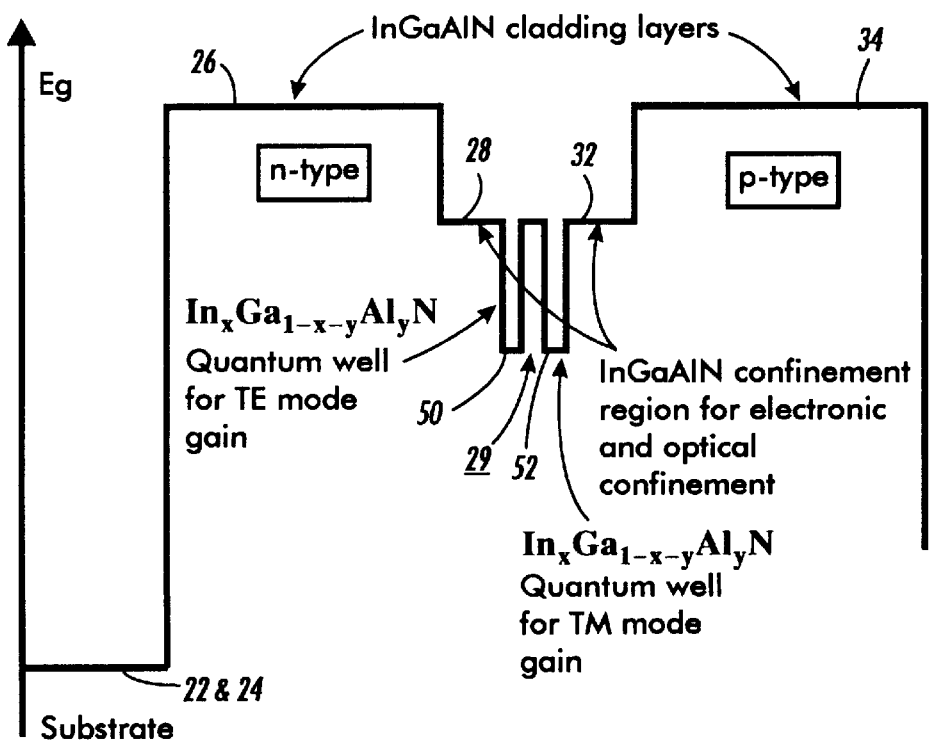
FIG. 6 is a graph showing the band-gap profile of the semiconductor laser structure of FIG. 2 with a multiple quantum wells for TE/TM mode polarization.

The structure represented by FIG. 6 is similar to that of FIG. 5, except that the second quantum well layer is added.

The present invention is not limited to achieving TE and TM mode QW lasers in the same monolithic structure by varying the thickness and/or composition of the active quantum well layer. If both active layers are in near degeneracy at the band edge, then whether the laser will oscillate in the TE or TM mode will depend upon other factors, such as, the diode geometry, its threshold current, its reflectivity, temperature, cavity length, etc. Hence, in accordance with this aspect of the invention, the active layers are given the same composition and thickness, preferably lying on the crossover point.

It will be clear from the descriptions given above that the invention is not limited to the examples given. It will be understood that the invention is not limited to the ridge waveguide semiconductor laser structure of FIG. 2 but also applies to stripe geometries, buried heterostructure junction structures, and other well-known semiconductor laser structures formed with III-V alloys with a single or multiple quantum well system. Similarly, other optical and carrier confining materials having comparable lattice constants and bandgaps can be substituted. It will also be evident that all of the conventional epitaxial growth techniques can be used, such as MO-VPE, MBE, and LPE, to manufacture the semiconductor crystalline structures described herein.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A laser diode comprising:
   (a) a substrate having a first lattice constant and a first bandgap,
   (b) a semiconductor layer structure deposited over said substrate, said semiconductor later structure having an active layer of a nitride-based III-V compound binary, ternary or quaternary alloy such that said active layer has a second lattice constant different from said first lattice constant and a second bandgap when unstrained, said active layer when deposited over said substrate being tensile strained, and
   (c) electrodes for passing current through the active layer to thereby cause TE or TM polarized laser emission in said active layer at a wavelength less than 600 nm.

2. The laser diode of claim 1 wherein the active layer comprises $In_xGa_{1-x-y}Al_yN$.

3. The laser diode of claim 2 wherein the active layer is flanked by confinement layers substantially lattice matched to the substrate and comprising $In_xGa_{1-x-y}Al_yN$.

4. The laser diode of claim 3 wherein the substrate comprises $Al_2O_3$, SIC, ZnO, AlN, GaN or InN.

5. The laser diode of claim 3 wherein the substrate comprises a semiconductor material and a buffer layer deposited over said substrate comprises AlN, GaN, InN, InGaN or GaAlN.

6. The laser diode of claim 1 wherein the active layer comprises GaN.

7. The laser diode of claim 1 wherein the active layer comprises InGaN.

8. The laser diode of claim 1 wherein the active layer comprises GaAlN.

9. The laser diode of claim 1 wherein the diode emits in the range of 350 to 450 nm.

10. The laser diode of claim 1 wherein the light hole and heavy hole band edges in said quaternary layer are substantially aligned, and further comprising means for controlling the polarization of the oscillating mode in the active layer.

11. The laser diode of claim 10 where the means for controlling comprises means for modifying laser losses.

12. The laser diode of claim 10 wherein said alignment of the light hole and heavy hole band edges is produced through balancing the shift in bandgap energy due to said tensile straining of said active layer by an opposite shift in the bandgap energy due to a selected combination of thickness and composition for said active layer.

13. The laser diode of claim 1 wherein said active layer further comprises: plural quantum wells, one of said quantum wells providing TE-mode gain, the other of said quantum wells providing TM-mode gain.

14. The laser diode of claim 1 wherein said active layer comprises a quantum well producing a gain-current relationship wherein transparency current is lowest in one polarization mode and peak gain is highest in an orthogonal polarization mode.

15. The laser diode of claim 1 wherein said active layer emits TM-polarized light and further comprising a second active layer which emits TE-polarized light.

16. A polarization-switchable semiconductor laser comprising:

(a) a semiconductor structure having one or more active portions of a material exhibiting heavy hole and light hole band edges and capable of lasing and providing TE-mode polarized gain from heavy hole band transitions and TM-mode polarized gain from light hole band transitions, (b) a quantum well laser structure in said one or more active portions, (c) electrodes for introducing carriers into said laser structure, (d) optical reflectors associated with said laser structure, (e) means connected to said laser structure for causing it selectively to lase in either its TE-mode or its TM-mode, and (f) the material of said one or more active portions comprising a tensile strained alloy of $In_xGa_{1-x-y}Al_yN$.

17. The polarization-switchable semiconductor laser of claim 16 wherein said one or more active portions has a single quantum well for which the heavy hole and light hole band edges substantially line up and the means for selectively causing it to lase comprises means for changing the threshold gain and current density.

18. A dual polarization, multi-beam emitting semiconductor quantum well laser comprising:

(a) a semiconductor structure having at least first and second active portions of a material exhibiting heavy hole and light hole band edges and capable of lasing and providing TE-mode polarized gain from heavy hole band transitions and TM-mode polarized gain from light hole band transitions, said first and second active portions forming adjacent first and second quantum well laser structures emitting, respectively, in the TE-mode and TM-mode, (b) electrode for introducing carriers into the active portions, (c) optical reflectors associated with each laser structure, (d) means connected to the adjacent laser structures for selectively activating same causing the first to lase in its TE-mode and the second to lase in its TM-mode, and (e) said active portions comprising a tensile-strained alloy of $In_xGa_{1-x-y}Al_yN$.

19. The dual polarization, multi-beam emitting semiconductor quantum well laser of claim 18 wherein said first active region is compressive, tensile, or unstrained for TE-mode operation and said second active region is tensile strained for TM-mode operation.

* * * * *